United States Patent
Miyagawa et al.

(10) Patent No.: US 8,702,903 B2
(45) Date of Patent: Apr. 22, 2014

(54) THERMALLY CONDUCTIVE SHEET AND SUBSTRATE MOUNTING DEVICE INCLUDING SAME

(75) Inventors: Masaaki Miyagawa, Nirasaki (JP); Akihiro Yoshimura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1466 days.

(21) Appl. No.: 12/055,633

(22) Filed: Mar. 26, 2008

(65) Prior Publication Data

US 2008/0239691 A1 Oct. 2, 2008

Related U.S. Application Data

(60) Provisional application No. 60/954,148, filed on Aug. 6, 2007.

(30) Foreign Application Priority Data

Mar. 27, 2007 (JP) ................................. 2007-081747

(51) Int. Cl.
- *C23C 16/50* (2006.01)
- *C23C 16/00* (2006.01)
- *C23F 1/00* (2006.01)
- *H01L 21/306* (2006.01)

(52) U.S. Cl.
USPC ............ 156/345.53; 156/345.51; 156/345.54; 118/728; 118/729

(58) Field of Classification Search
USPC ................. 118/715, 728, 729, 730, 731, 732; 156/345.51–345.55
See application file for complete search history.

(56) References Cited

U.S. PATENT DOCUMENTS

| | | | |
|---|---|---|---|
| 5,376,213 A * | 12/1994 | Ueda et al. ............... | 156/345.53 |
| 6,464,794 B1 * | 10/2002 | Park et al. ..................... | 118/728 |
| 6,723,202 B2 | 4/2004 | Nagaiwa et al. | |
| 6,733,624 B2 | 5/2004 | Koshiishi et al. | |
| 2003/0215578 A1 * | 11/2003 | Okumura et al. ............. | 427/569 |
| 2004/0261946 A1 * | 12/2004 | Endoh et al. ............. | 156/345.15 |
| 2005/0087305 A1 * | 4/2005 | Nishio et al. ............. | 156/345.51 |
| 2005/0172904 A1 * | 8/2005 | Koshimizu et al. ........... | 118/728 |
| 2007/0169891 A1 | 7/2007 | Koshiishi et al. | |

FOREIGN PATENT DOCUMENTS

| | | |
|---|---|---|
| JP | 2001-291807 | 10/2001 |
| JP | 2001-308079 | 11/2001 |
| JP | 2002-16126 | 1/2002 |
| JP | 2003-133770 | 5/2003 |
| WO | WO 2005/059962 A2 | 6/2005 |

OTHER PUBLICATIONS

Japanese Decision of Rejection issued Oct. 5, 2011, in Japanese Application No. 2007-081747, filed Mar. 29, 2007 with an English Translation.

* cited by examiner

*Primary Examiner* — Maureen Gramaglia
*Assistant Examiner* — Tiffany Nuckols
(74) *Attorney, Agent, or Firm* — Rothwell, Figg, Ernst & Manbeck, P.C.

(57) ABSTRACT

A thermally conductive sheet is used between a mounting table for mounting thereon a target substrate and an annular focus ring mounted on the mounting table to surround a circumferential peripheral portion of the target substrate. Further, the mounting table includes therein a cooling unit and is disposed in a depressurized accommodating chamber for accommodating therein the target substrate. The thermally conductive sheet has a non-adhesive layer on each of one or more surfaces thereof.

15 Claims, 6 Drawing Sheets

(COMPARATIVE EXAMPLE 1)

(COMPARATIVE EXAMPLE 2)

(TEST EXAMPLE 1)

(TEST EXAMPLE 2)

(COMPARATIVE EXAMPLE 1)

(COMPARATIVE EXAMPLE 2)

(TEST EXAMPLE 1)

(TEST EXAMPLE 2)

THERMALLY CONDUCTIVE SHEET AND SUBSTRATE MOUNTING DEVICE INCLUDING SAME

FIELD OF THE INVENTION

The present invention relates to a thermally conductive sheet for improving thermal conductivity between a focus ring used for performing a specific plasma processing, i.e, an etching process or the like, on a target substrate, i.e., a semiconductor wafer or the like, and a mounting table for mounting thereon the target substrate, and to a substrate mounting device including the same.

BACKGROUND OF THE INVENTION

A plasma processing is widely applied in a semiconductor device manufacturing apparatus, e.g., a surface processing apparatus, an etching process or the like. In order to perform the plasma processing, a substrate mounting device for mounting a target substrate, e.g., a wafer or the like, is installed inside a processing chamber. For example, as shown in FIG. 6, the substrate mounting device includes a mounting table for mounting thereon a wafer 1 and a focus ring 3 disposed around an outer peripheral portion of the mounting table 2.

In order to perform the plasma processing on the wafer 1, the wafer 1 is mounted and fixed on the mounting table 2 while maintaining the processing chamber at a specific vacuum level. Next, a high frequency voltage is applied to the mounting table 2 to thereby generate a plasma inside the processing chamber.

Here, the focus ring 3 is installed for uniformly performing the plasma processing on the entire surface of the target substrate by moderating discontinuity of the plasma in a peripheral portion of the target substrate. To do so, the focus ring 3 is made of a conductive material and, also, a height of a top surface thereof is made substantially the same as that of a processing surface of the target substrate. Accordingly, ions are projected perpendicularly to the surface of the target substrate even in the peripheral portion of the target substrate, thereby preventing any difference from being developed between the ion density in the peripheral portion of the target substrate and that in a central portion of the target substrate. As a consequence, however, the target substrate and the focus ring 3 have substantially a same potential, and the plasma can easily flow into a backside of an end portion of the target substrate due to an electric field generated by the same potential, causing a deposition of CF-based polymer or the like onto a backside of a circumferential peripheral portion (edge portion) of the target substrate.

Therefore, Patent Document 1 suggests a technique in which the electric field in the circumferential peripheral portion (edge portion) of the target substrate is changed by adjusting a part of characteristics (impedance characteristics) of a material forming the ring so that the deposition of CF-based polymer or the like is prevented from being deposited onto the backside of the circumferential peripheral portion (edge portion) of the target substrate by inhibiting the plasma from flowing into the backside of the target substrate.

Namely, in the above technique, the focus ring 3 includes an upper member 3a and a lower member 3b, as shown in FIG. 7, and a dielectric constant thereof is adjusted by using a conductive material for the upper member 3a and a dielectric material for the lower member 3b. Accordingly, directions of electric force lines in the circumferential peripheral portion of the target substrate are changed such that the plasma is prevented from flowing into the backside of the target substrate.

Moreover, the temperature control of the wafer 1 is extremely crucial in the plasma processing, so that the wafer 1 is regulated to be maintained at a required temperature by a cooling mechanism provided in the mounting table 2. For example, a helium gas having a good thermal conductivity flows from the top surface of the mounting table 2 toward the backside of the wafer 1, thereby increasing thermal conductivity between the wafer 1 and the mounting table 2.

Besides, a heat insulating vacuum layer formed between the mounting table 2 and the focus ring 3 makes the thermal conductivity between the mounting table 2 and the focus ring 3 extremely poor in a depressurized accommodation chamber. Therefore, the focus ring 3 is not cooled at all, thus increasing the temperature of the focus ring 3. Accordingly, a composition ratio or a density of ions and radicals in the plasma in the circumferential peripheral portion of the wafer is changed. As a result, a hole penetration property (characteristic allowing the substrate to be etched to a specific depth) or an etching rate in the circumferential peripheral portion of the wafer deteriorates, or an aspect ratio of the etching deteriorates. Namely, the etching characteristics in the circumferential peripheral portion of the wafer become poor.

In order to prevent the temperature increase of the focus ring, Patent Document 2 suggests "a substrate mounting device in which a heat insulating vacuum layer is not formed by interposing a heat transfer medium between a mounting table and a focus ring and by installing a pressing unit for pressing and fixing the focus ring on the mounting table".

Moreover, Patent Document 3 discloses therein "a substrate mounting device having an electrostatic attracting unit for attracting a focus ring". Since, however, this device needs an electrode for electrostatically attracting the focus ring, a structure of the device becomes complicated, and the installation cost increases. In addition, the electrode for electrostatic adsorption may cause an abnormal discharge of a plasma, or generate particles or deposits.

Therefore, the inventors of the present invention suggested a unit for enhancing thermal conductivity in a peripheral portion of a wafer by interposing a heat transfer medium (corresponding to a thermally conductive sheet in the present invention) made of a gel type material between a focus ring and a mounting table of a target substrate in a plasma processing chamber. The thermally conductive sheet is made of a gel type polymer and thus has good flexibility. Accordingly, a heat insulating vacuum layer is not formed on a contact surface between the focus ring 3 and the mounting table 2, thereby facilitating the heat transfer therebetween.

Although it is preferable that the thermally conductive sheet has flexibility and thermal conductivity, the thermally conductive sheet is made of a material in which a ratio (H/k) of a hardness H of the corresponding sheet which is indicated in terms of ASKER C to a thermal conductivity k indicated as W/m·k is smaller than 20. Namely, it is important to use a material having a high thermal conductivity. Further, it has been confirmed that the presence of the thermally conductive sheet allows the focus ring 3 to be sufficiently cooled and prevents the deterioration of the etching characteristics in the circumferential peripheral portion of the target substrate.

Patent Document 1: Japanese Patent Laid-open Application No. 2005-277369

Patent Document 2: Japanese Patent Laid-open Application No. 2002-16126

Patent Document 3: Japanese Patent Laid-open Application No. 2002-33376

The above-described thermally conductive sheet is very useful to facilitate the heat transfer between the focus ring and the mounting table. However, the thermally conductive sheet is made of a gel type polymer and thus can easily adhere to a ceramic surface or a metal surface that contacts therewith. Moreover, the focus ring needs to be frequently exchanged by processes, and it is often found during the exchange procedure that the thermally conductive sheet is strongly adhered to a surface of the mounting table or the focus ring. The strongly adhered thermally conductive sheet cannot be separated if an exclusive peeling jig is not used, thus significantly deteriorating efficiency of the exchange procedure of the focus ring or the electrostatic chuck.

SUMMARY OF THE INVENTION

Therefore, an object of the present invention is to prevent a thermally conductive sheet made of a polymer material for facilitating heat transfer from being adhered to the focus ring or the mounting table, the thermally conductive sheet being provided between a contact surface of a focus ring and that of a mounting table in a substrate mounting device having the focus ring.

As described above, in order to prevent the adhesion of the thermally conductive sheet, a property of a surface of the thermally conductive sheet needs to be changed. However, if the property of the thermally conductive sheet is changed and the heat conduction characteristics thereof are deteriorated due to the change, this contradicts to thereby adversely affect the original purpose of introducing the thermally conductive sheet for facilitating the heat transfer. Therefore, another object of the present invention is to avoid the deterioration of the heat transfer between the focus ring and the mounting table while preventing the thermally conductive sheet from being adhered to a solid surface.

In accordance with a first aspect of the present invention, there is provided a thermally conductive sheet to be used between a mounting table for mounting thereon a target substrate and an annular focus ring mounted on the mounting table to surround a circumferential peripheral portion of the target substrate, the mounting table having therein a cooling unit and being disposed in a depressurized accommodating chamber for accommodating therein the target substrate, wherein the thermally conductive sheet has a non-adhesive layer on each of one or more surfaces thereof. Accordingly, the heat can be transferred from the mounting table to the focus ring even under the environment in which the heat can be hardly transferred due to vacuum insulation and, also, the thermally conductive sheet can be prevented from being adhered to the focus ring or the mounting table.

It is preferable that the non-adhesive layer is a metal thin film. Further, the non-adhesive layer may be obtained by performing a mold release treatment on each of the surfaces of the thermally conductive sheet and the release treatment may be performed by coating a silicone resin-based or fluorine-based releasing agent. Further, the non-adhesive layer may be a polymer film and it is preferable that the non-adhesive polymer film is a polyethylene terephthalate film, a polyester film or a polypropylene film.

Further, it is preferable that the metal thin film is made of Al.

In accordance with a second aspect of the present invention, there is provided a substrate mounting device including: a depressurized accommodation chamber for accommodating therein a target substrate; a mounting table for mounting thereon the target substrate, the mounting table having therein a cooling unit and being provided in the accommodation chamber; and an annular focus ring mounted on the mounting table to surround a circumferential peripheral portion of the target substrate; and a thermally conductive sheet having a non-adhesive layer on thereof and provided between the mounting table and the focus ring.

By providing the thermally conductive sheet between the mounting table and the focus ring, the heat can be transferred from the mounting table to the focus ring even under the environment in which the heat can be hardly transferred due to the vacuum insulation and, also, the thermally conductive sheet can be prevented from being adhered to the focus ring or the mounting table.

It is preferable that the substrate mounting device further includes a pressing unit for pressing the focus ring to the mounting table.

By installing the pressing unit, a heat insulating vacuum layer is not formed on a contact surface between the focus ring and the mounting table. As a result, the heat transfer therebetween is facilitated.

It is preferable that a pressing force of the pressing unit is greater than or equal to about 5.63 kgf/cm$^2$. Further, it is preferable that the focus ring includes a ring-shaped lower member being in contact with the mounting table and a ring-shaped upper member mounted on a top surface of the lower member, and the pressing unit fixes the lower member to the mounting table by tightening screws.

In accordance with embodiments of the present invention, it is possible to prevent a thermally conductive sheet provided between a contact surface of a focus ring and that of a mounting table from being adhered to the focus ring or the mounting table while ensuring good thermal conductivity. As a result, the efficiency of exchanging the focus ring or the mounting table can be markedly improved.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

Hereinafter, embodiments of the present invention will be described in detail with reference to the accompanying drawings which form a part hereof.

Figure 1:
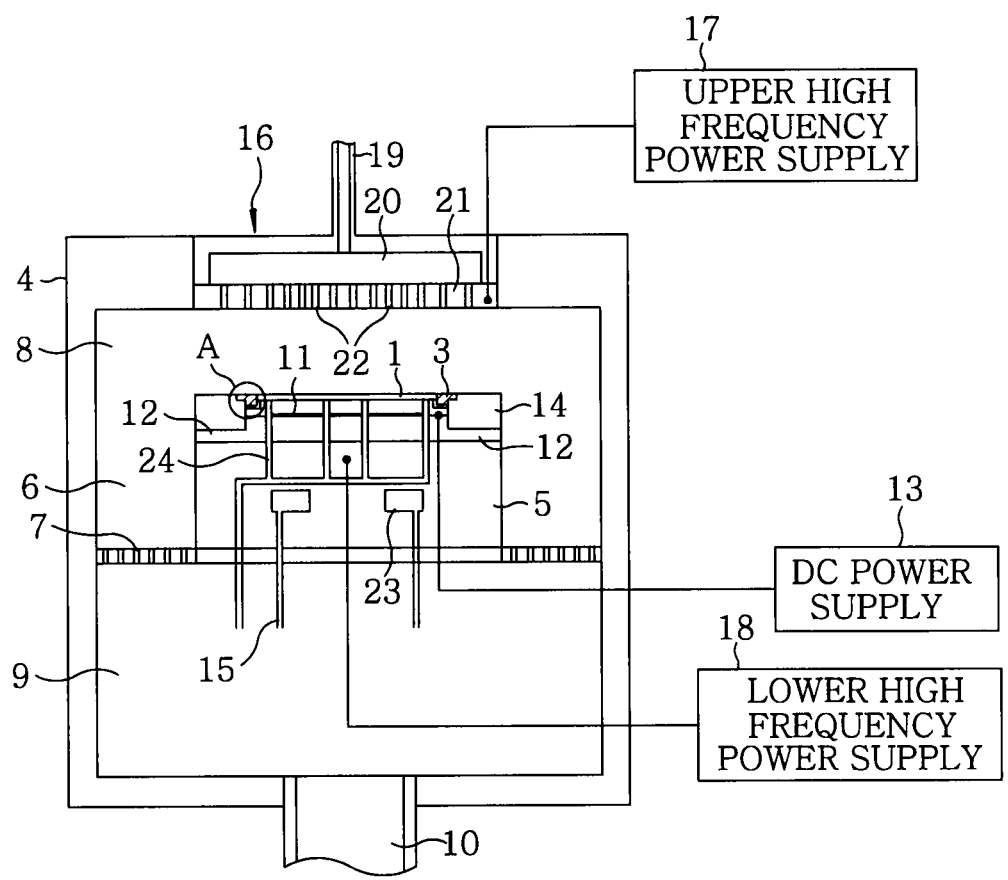
FIG. 1 is a schematic cross sectional view of an example of a plasma processing apparatus in accordance with an embodiment of the present invention.

The present invention relates to a thermally conductive sheet for facilitating heat transfer and a substrate mounting device including the same. First of all, the substrate mounting device in accordance with an embodiment of the present invention will be described. FIG. 1 is a schematic cross sectional view of an example of a plasma processing apparatus in accordance with an embodiment of the present invention. This apparatus includes a chamber 4 for accommodating a semiconductor wafer 1. Provided in the chamber 4 are an electrostatic chuck 12 and a cylindrical susceptor 5, both forming a mounting table for mounting thereon the wafer 1. A side exhaust passageway 6 for exhausting gas is formed between an inner wall of the chamber 4 and a side surface of the susceptor 5, and an exhaust plate 7 formed as a porous plate is provided in the middle of the side exhaust passageway 6. The exhaust plate 7 functions as a partition plate for vertically partitioning the chamber 1. A portion above the exhaust plate 7 becomes a reaction chamber 8, and a portion below the exhaust plate 7 becomes an exhaust chamber 9. In the exhaust chamber 9, an exhaust line 10 opens, and the inside of the chamber 4 is vacuum exhausted by a vacuum pump (not shown).

Disposed on an upper portion of the susceptor 5 is the electrostatic chuck 12 having therein an electrostatic electrode plate 11. The electrostatic chuck 12 is formed by placing an upper disk-shaped member having a small diameter over a lower disk-shaped member. The upper disk-shaped member has on a top surface thereof a layer made of a dielectric material (ceramic or the like). Thus, when a DC high voltage is applied to the electrostatic electrode plate 11 connected to a DC power supply 13, an electrostatic potential is generated on the surface of the upper disk-shaped member, thereby adsorptively holding the wafer 1 mounted thereon by Coulomb force or Johnson-Rahbek force.

The electrostatic chuck 12 is fixed to the susceptor 5 by screws, and the focus ring 3 is installed between an insulating member 14 and the wafer 1. The insulating member 14 prevents the plasma from diffusing excessively toward a peripheral direction and leaking from the exhaust plate 7 to an exhaust side by restricting an electric field. A surface of the focus ring 3 is made of a conductive material, e.g., silicon, silicon carbide or the like. The focus ring 3 covers the peripheral portion of the wafer 1, and has a surface exposed to a space inside the reaction chamber 8, thereby collecting the plasma in the reaction chamber onto the wafer.

The plasma is generated in the reaction chamber by the effect of a high frequency power applied from an upper high frequency power supply 17 to a gas inlet shower head 16 provided above the reaction chamber 8 and a high frequency power applied from a lower high frequency power supply 18 to the susceptor 5. A reaction gas supplied into the gas inlet shower head 16 through a gas inlet line 19 becomes a plasma while passing through a plurality of gas openings 22 provided in an upper electrode plate 21 via a buffer chamber 20, and then is supplied to the reaction chamber 8.

The wafer 1 exposed to the high-temperature plasma has an increased temperature and thus needs to be cooled by transferring heat to the susceptor 5. To do so, the susceptor 5 is made of a metal material having good thermal conductivity, and has therein a coolant channel 23. The susceptor 5 is cooled by circulating in the coolant channel 23 a coolant, e.g., water, ethylene glycol or the like, supplied through a coolant supply line 15. Besides, a plurality of thermally conductive gas supply openings 24 is formed on a surface that is provided for attracting the wafer 1. By injecting helium through these openings, a backside of the wafer 1 is cooled.

Figure 2:
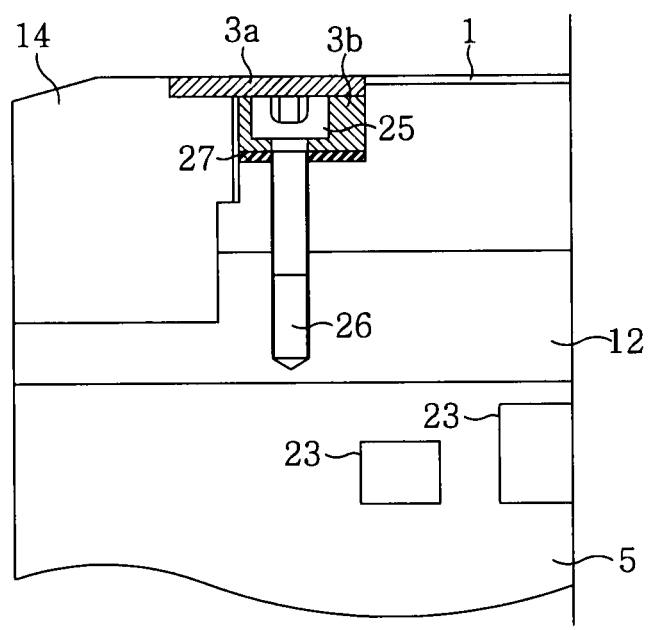
FIG. 2 shows a structure of a focus ring in the apparatus in accordance with the embodiment of the present invention.

FIG. 2 is a cross sectional view of details of the focus ring 3 in the device in accordance with the embodiment of the present invention, and also is an enlarged view of an "A" portion in FIG. 1. The wafer 1 is electrostatically adsorbed to be held on the electrostatic chuck 12. The electrostatic chuck 12 is fixed to the susceptor 5 by screws, and the coolant channel 23 is provided in the susceptor 5.

The focus ring 3 has an upper member 3a and a lower member 3b. The lower member 3b is a ring-shaped member made of a dielectric material or a conductive material, and is fixed on the electrostatic chuck 12 via a thermally conductive sheet 27. The upper member 3a is a ring-shaped member made of a conductive material, and is mounted on the lower member 3b. The lower member 3b has a bolt hole (hole capable of receiving a bolt head portion 25) where a bolt is inserted and fitted, and a thread to be screw-coupled to a bolt end portion 26 is formed in the electrostatic chuck 12.

Disposed between the lower member 3b and the electrostatic chuck 12 is the thermally conductive sheet 27 made of a polymer material. The thermally conductive sheet 27 is provided between the contact surface of the focus ring 3 and that of the electrostatic chuck 12 to fill the gap therebetween, to thereby facilitate the heat transfer therebetween. Thus, the thermally conductive sheet 27 is made of a polymer material (preferably, a gel type polymer) having excellent flexibility and thermal conductivity.

In the present invention, the thermally conductive sheet 27 is prevented from being adhered or fixed to the electrostatic chuck 12 or the lower member 3b by forming a non-adhesive layer on at least one surface (the electrostatic chuck 12 side in this embodiment) thereof.

Figure 3A:
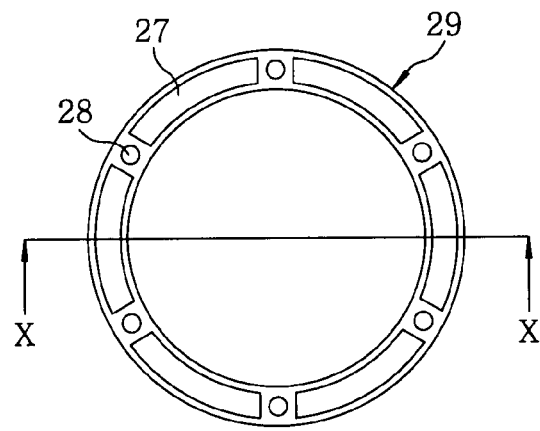
FIGS. 3A to 3C illustrate a structure of a thermally conductive sheet in the embodiment of the present invention.
Figure 3B:
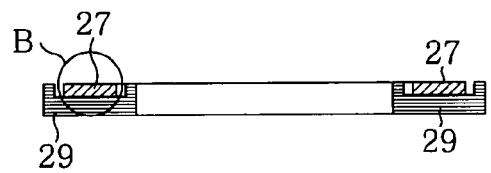
Figure 3C:
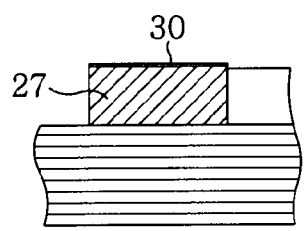

FIGS. 3A to 3C depict a structure of the thermally conductive sheet 27 used in this embodiment, wherein FIG. 3A is a bottom view seen from the electrostatic chuck 12 side; FIG. 3B is a cross sectional view taken along line X-X of FIG. 3A; and FIG. 3C is an enlarged view of a "B" portion in FIG. 3B. The thermally conductive sheet 27 is attached to a ring 29 (corresponding to the lower member 3b in FIG. 2) where bolt holes 28 are formed at regular intervals, and has a non-adhesive layer 30 on one surface thereof (a top surface in FIG. 3B, which becomes a bottom surface in actual use since the ring is to be turned upside-down when it is used).

The thermally conductive sheet 27 may be formed of a sheet made of a gel type polymer or can be obtained by impregnating a gel type polymer into a polymer (e.g., expandable resin) sheet serving as a frame material (if necessary, a filling material may be added to the gel type polymer), and features good flexibility and thermal conductivity. Preferably, the sheet has physical properties in which a ratio (H/k) of a hardness H represented by ASKER C to a thermal conductivity k represented by W/m·k is smaller than 20 and the thermal conductivity k is high. A thermal resistance of the thermally conductive sheet 27 itself can be decreased to be negligibly small by using, e.g., silicon gel, and reducing a thickness of the sheet.

The non-adhesive layer 30 prevents the thermally conductive sheet 27 from being adhered to the focus ring 3 or the electrostatic chuck 12. Although the non-adhesive layer 30 can be formed by various methods, following methods will be explained as specific examples.

(1) Method for Forming a Metal Thin Film on a Surface of the Thermally Conductive Sheet 27

As for a metal, it is preferable to use a metal, e.g., aluminum, silicon or the like, that can hardly contaminate the wafer 1. A metal thin film can be formed by any method, e.g., a method for attaching a metal foil, a method for forming a deposited film, or the like. If a metal foil having an excessive thickness is attached, plastic deformation becomes difficult, thereby deteriorating the adhesivity between the thermally conductive sheet and the electrostatic chuck. Therefore, a thickness of the metal foil is preferably about 6 μm and is smaller than or equal to about 10 µm to the maximum. This is because if a thickness of the metal foil is greater than or equal to about 10 µm, the metal foil cannot fill irregularities on a surface of the focus ring having a surface roughness of about 0.1 µm and on a surface of the electrostatic chuck having a surface roughness of about 1.6 µm.

(2) Method for Adhering a Non-Adhesive Polymer Film on a Surface of the Thermally Conductive Sheet 27

As for a non-adhesive polymer film, there can be exemplified a polyethylene terephthalate (PET) film, a polyester film, a polypropylene (PP) film or the like. These films have low thermal conductivity and thus preferably have a thin thickness. Since the polymer film is difficult to be plastically deformed, it is preferable that a thickness thereof is smaller than or equal to, e.g., about 10 µm. Although the method for adhering the above film onto the surface of the thermally conductive sheet 27 need not be restricted, it is preferable to use a thermal pressing method or a method using an adhesive.

(3) Method for Coating Resin Having a Releasability on a Surface of the Thermally Conductive Sheet 27

A resin having a releasability can be exemplified by a silicone resin, a fluorine resin or the like. Although the coating method is not restricted, it is preferable to use a spin-coating or spray-coating method for applying solution obtained by dissolving resin in a solvent.

The thermally conductive sheet 27 can be used between the lower member 3b of the focus ring 3 and the electrostatic chuck 12 or between the upper member 3a and the lower member 3b of the focus ring 3. The inventors of the present invention have found that when the thermally conductive sheet 27 is used between the upper member 3a and the lower member 3b of the focus ring 3, heat is not sufficiently transferred from the electrostatic chuck 12 to the focus ring 3. This is because the weight of the upper member 3a is not enough to tightly adhere the thermally conductive sheet 27 to the lower member 3b. Accordingly, a heat insulating vacuum layer is formed therebetween, thereby increasing the thermal resistance. Therefore, it is more effective when the thermally conductive sheet 27 is used between the lower member 3b of the focus ring 3 and the electrostatic chuck 12.

The non-adhesive layer 30 is preferably formed on at least one surface of the thermally conductive sheet 27. When the surface where the non-adhesive layer 30 is formed is arranged to face downward to contact the electrostatic chuck 12 side, the thermally conductive sheet 27 is adhered to the lower member 3b of the focus ring 3, not to the electrostatic chuck 12 side. It is preferable to make the non-adhesive layer 30 face downward. Then, the thermally conductive sheet 27 is adhered to the focus ring 3 side, and thus can be separated together with the focus ring 3. However, depending on the purposes, the non-adhesive layer 30 can be formed on both surfaces of the thermally conductive sheet 27 without being limited to the above example.

When using the thermally conductive sheet 27, it should be noted that the non-adhesive layer 30 needs to be tightly adhered to a hardly deformable solid surface facing thereto. Otherwise, a heat insulating vacuum layer is formed therebetween, increasing the thermal resistance. According to the foregoing reasoning of the inventors of the present invention, if the focus ring 3 is not pressed to the electrostatic chuck 12, the thermal resistance between the focus ring 3 and the electrostatic chuck 12 often increases. As a result, the temperature of the focus ring 3 increases, which is not preferable.

Hence, the substrate mounting device of the present invention is characterized in that the thermally conductive sheet 27 having a non-adhesive layer on at least one surface thereof is disposed between a contact surface of the electrostatic chuck 12 and that of the focus ring 3, and also in that there is installed a pressing unit for pressing the focus ring 3 to the electrostatic chuck 12. It was found that the pressing force thereof is preferably greater than or equal to about 5.63 kgf/cm$^2$. As for the pressing unit, there is generally used a unit for tightening a bolt as shown in FIG. 2. However, the pressing unit is not limited thereto, and can be modified as long as the aforementioned pressing force can be obtained.

TEST EXAMPLE

An experiment was performed to compare an attachment state of the thermally conductive sheet 27 of the present invention which has a non-adhesive layer formed by using the plasma processing apparatus of FIGS. 1 and 2 with that of the conventional thermally conductive sheet 27 having no non-adhesive layer. Further, heat dissipation characteristics from the focus ring 3 to the electrostatic chuck 12 of the thermally conductive sheet 27 of the present invention was compared with that of the conventional thermally conductive sheet 27. Since a plasma etching rate in a circumferential peripheral portion of a target substrate is related in inverse proportion to a temperature of the focus ring 3, the heat generation characteristics were evaluated by measuring the etching rate.

A non-adhesive layer made of PET was formed on one surface of the thermally conductive sheet 27 of a test example 1. A non-adhesive layer made of an Al thin film was formed on one surface of the thermally conductive sheet 27 of a test example 2. A conventional thermally conductive sheet having no non-adhesive layer was used as a comparative example 1. As for a thermally conductive sheet, there was used a heat dissipating sheet (a thermal conductivity of 17 W/mk, a thickness of about 0.5 mm) made by Fuji Polymer Co. Ltd. The non-adhesive layer was a polyester film of about 6 µm in thickness in the test example 1 and was an aluminum thin film of about 10 µm in thickness in the test example 2.

The plasma processing was carried out under high power conditions of high heat input on HARC (high aspect ratio contact) and under lower power conditions of low heat input on BARC (bottom anti-reflection coating). The high power conditions (HARC) were as follows: a pressure in the chamber was about 15 mT; an upper/lower electrode power were about 2700/4500 W; a gas flow rate of $C_4F_8/Ar/O_2$ was about 60/300/34 sccm; and the etching was performed for about 60 seconds. Meanwhile, the lower power conditions (BARC) were as follows: a pressure in the chamber was about 100 mT; an upper/lower electrode power were about 500/500 W; a gas flow rate of $CF_8$ was about 150 sccm; and the etching was performed for about 60 seconds.

The thermally conductive sheet 27 was adhered so that the non-adhesive layer would be a bottom side (electrostatic chuck side). After completing the above process, the focus ring 3 was separated to check the attachment state of the thermally conductive sheet 27. The result thereof will be described hereinafter.

First of all, in the test examples 1 and 2, when the focus ring 3 was separated, it was found that the thermally conductive sheet 27 was entirely adhered to the lower member side of the focus ring 3 and no deposit was adhered on the surface of the electrostatic chuck side. Therefore, when the focus ring 3 was separated, the thermally conductive sheet 27 was also separated. Accordingly, the cleaning time for the electrostatic chuck 12 was not required during the exchange of the focus ring 3.

On the contrary, in the comparative example, when the focus ring 3 was separated, it was found that the thermally conductive sheet 27 was entirely adhered to the electrostatic chuck side. Therefore, when the focus ring 3 was exchanged, the electrostatic chuck 12 was also separated. As a result, there was required an operation for removing the thermally conductive sheet 27 from the electrostatic chuck 12 by using an exclusive jig.

In the actual operation time, about 2.5 minutes to about 3 minutes were required to separate the focus ring 3, whereas more than 15 minutes were required to clean the electrostatic chuck (the removal of a coolant in the susceptor, the separation of the electrostatic chuck, the removal of the thermally conductive sheet 7 and the like). Therefore, it was found that the thermally conductive sheet 27 of the present invention makes it possible to reduce the exchange time of the focus ring 3 by ⅙ or more, thereby greatly improving the efficiency of the operation in the present invention.

Moreover, it was found by the etching test that even if the non-adhesive layer was formed on the thermally conductive sheet, the thermal conductivity thereof did not deteriorate. In the etching test, an etching rate was measured at intervals ranging from about 20 mm to about 30 mm in X and Y directions of a diameter of a target substrate under the HARC conditions and the BARC conditions. The etching rate was measured by an interferometric film thickness measurement method. A comparative example 2 shows a case in which a thermally conductive sheet is not used, i.e., a case in which the focus ring 3 and the electrostatic chuck 12 are in direct contact with each other.

Figure 4:
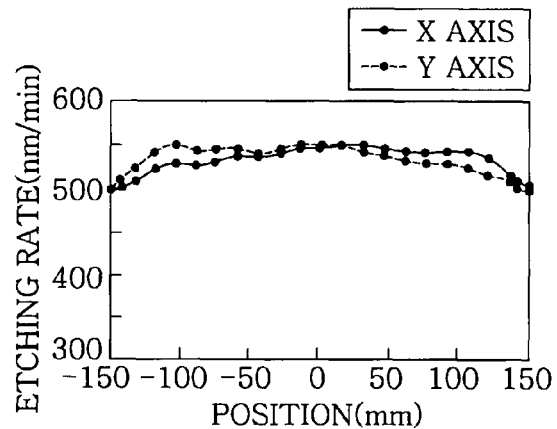
FIG. 4 presents examples of measurement results of etching rates under high power conditions in the embodiment of the present invention.
Figure 4:
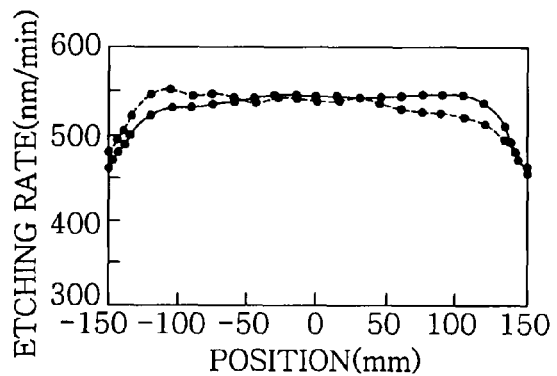
Figure 4:
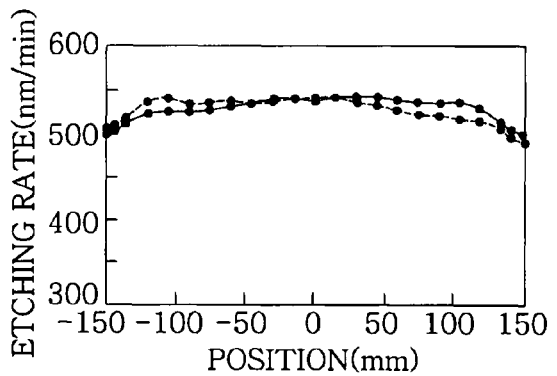
Figure 4:
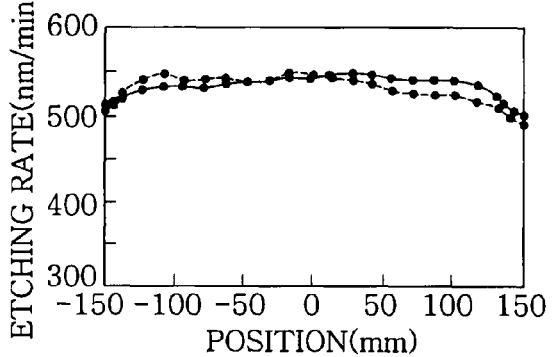

FIG. 4 presents graphs showing the measurement results obtained under the HARC conditions. Above all, the HARC conditions of high power will be explained. Here, the comparative example 1 where a conventional thermally conductive sheet having no non-adhesive layer was used was compared with the comparative example 2 where a thermally conductive sheet was not used. In the comparative example 2, the etching rate in a circumferential peripheral portion of a wafer was reduced by about 20% compared to that in a central portion. Meanwhile, in the comparative example 1, the etching rate in the circumferential peripheral portion was reduced by about 10% compared to that in the central portion. This is because the heat transfer from the electrostatic chuck 12 to the focus ring 3 is facilitated by the thermally conductive sheet.

Meanwhile, a pattern of deterioration in the etching rate in the circumferential peripheral portion of the target substrate is similar in all the test examples 1 and 2 and the comparative example 1. This indicates that the thermal conductivity of the thermally conductive sheet 27 having a non-adhesive layer on a surface thereof is the same as that of the conventional thermally conductive sheet. Namely, if a non-adhesive layer is formed on the conventional thermally conductive sheet as described above, the heat is transferred from the electrostatic chuck 12 to the focus ring 3, thereby cooling the focus ring 3 as in the conventional thermally conductive sheet. In order to avoid the deterioration of the thermal conductivity, it is important to press the focus ring 3 to the electrostatic chuck 12. In this embodiment, however, the lower member 3b of the focus ring 3 is fixed to the electrostatic chuck 12 by screws.

Figure 5:
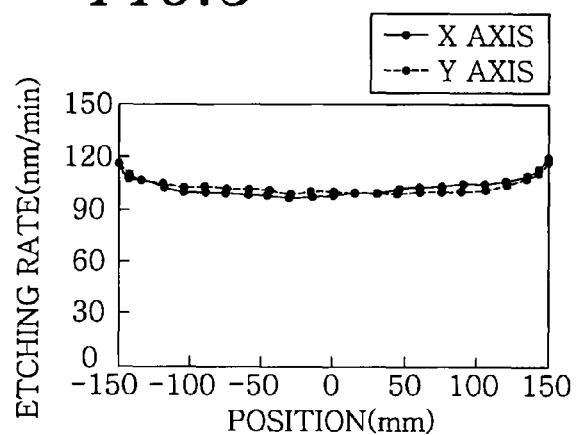
FIG. 5 represents examples of measurement results of etching rates under low power conditions in the embodiment of the present invention.
Figure 5:
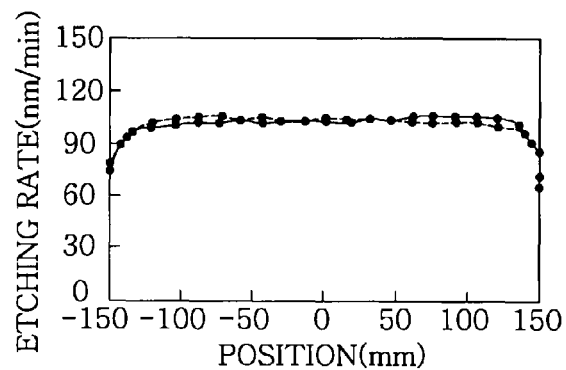
Figure 5:
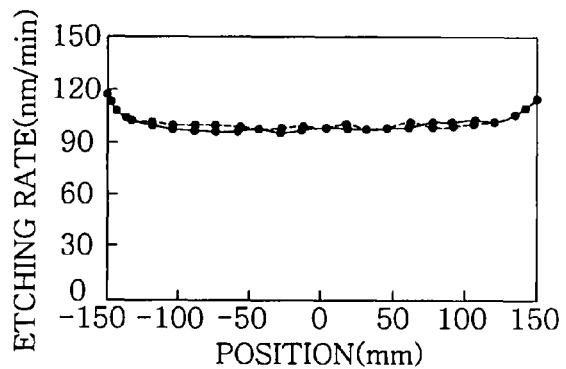
Figure 5:
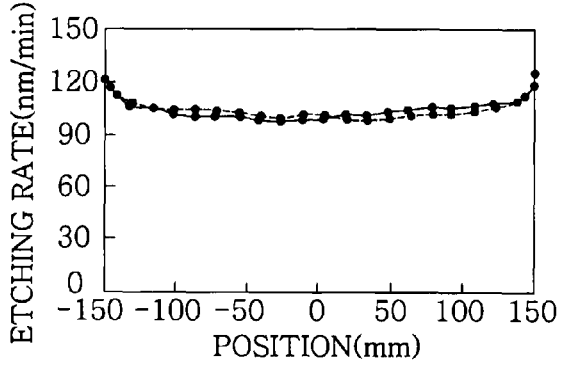
Figure 6:
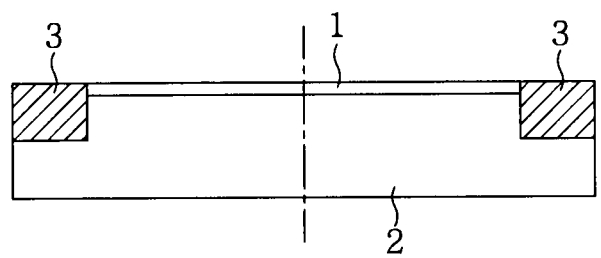
FIG. 6 depicts a configuration of a conventional substrate mounting device.
Figure 7:
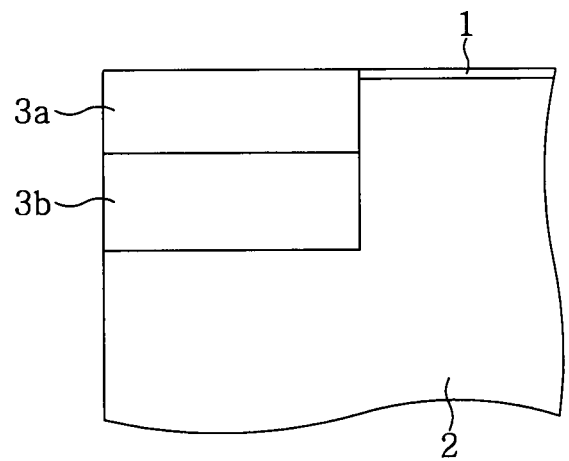
FIG. 7 describes a structure of a focus ring in the conventional substrate mounting device.

FIG. 5 presents graphs showing the measurement results obtained under the BARC condition of low power. The comparative examples 1 and 2 show remarkably different tendencies of the etching rate in the circumferential peripheral portion of the target substrate. This is because, in the comparative example 2, a heat insulating vacuum layer is formed between the electrostatic chuck 12 and the focus ring 3. Accordingly, the temperature of the focus ring 3 increases, and the etching rate in the circumferential peripheral portion of the wafer deteriorates markedly.

Meanwhile, in the test examples 1 and 2, the etching rate in the circumferential peripheral portion of the target substrate is higher, which is similar to the pattern in the comparative example 1. As in the HARC conditions, this indicates that the use of the thermally conductive sheet 27 having a non-adhesive layer on a surface thereof as in the HARC conditions makes it possible to cool the focus ring 3 as in the comparative example 1.

While the invention has been shown and described with respect to the embodiments, it will be understood by those skilled in the art that various changes and modification may be made without departing from the scope of the invention as defined in the following claims.

What is claimed is:

1. A thermally conductive sheet to be used between a mounting table for mounting thereon a target substrate and an annular focus ring mounted on the mounting table to surround a circumferential peripheral portion of the target substrate, the mounting table having therein a cooling unit and being disposed in a depressurized accommodating chamber for accommodating therein the target substrate,
wherein the thermally conductive sheet has a non-adhesive layer on one or more surfaces thereof and the thermally conductive sheet is made of a gel type polymer;
wherein said one or more surfaces include a mounting table side surface such that the non-adhesive layer is arranged between the thermally conductive sheet and the mounting table;
wherein the non-adhesive film is a metal thin film; and
wherein a thickness of the metal thin film is not less than 6 μm but not greater than 10 μm.

2. The thermally conductive sheet of claim 1, wherein the metal thin film is made of Al.

3. The thermally conductive sheet of claim 1, wherein said one or more surfaces further include a focus ring side surface of the thermally conductive sheet.

4. The thermally conductive sheet of claim 1, wherein the thermally conductive sheet has a ratio H/k of a hardness in ASKER C to a thermal conductivity in W/m·k which is less than 20.

5. A substrate mounting device comprising:
a depressurized accommodation chamber for accommodating therein a target substrate;
a mounting table for mounting thereon the target substrate, the mounting table having therein a cooling unit and being provided in the accommodation chamber;
an annular focus ring mounted on the mounting table to surround a circumferential peripheral portion of the target substrate;
a thermally conductive sheet having a non-adhesive layer on one or more surfaces thereof and provided between the mounting table and the focus ring;
wherein the thermally conductive sheet is made of a gel type polymer;
wherein said one or more surfaces include a mounting table side surface such that the non-adhesive layer is arranged between the thermally conductive sheet and the mounting table
wherein the non-adhesive film is a metal thin film; and
wherein a thickness of the metal thin film is not less than 6 μm but not greater than 10 μm.

6. The substrate mounting device of claim 5, further comprising a pressing unit for pressing the focus ring to the mounting table.

7. The substrate mounting device of claim 6, wherein a pressing force of the pressing unit is greater than or equal to about 5.63 kgf/cm$^2$.

8. The substrate mounting device of claim 6, wherein the focus ring includes a ring-shaped lower member and a ring-shaped upper member mounted on a top surface of the lower member, and the pressing unit fixes the lower member to the mounting table by tightening screws.

9. The substrate mounting device of claim 5, wherein the metal thin film is made of Al.

10. The substrate mounting device of claim 5, wherein said one or more surfaces further include a focus ring side surface of the thermally conductive sheet.

11. The substrate mounting device of claim 5, wherein the thermally conductive sheet has a ratio H/k of a hardness in ASKER C to a thermal conductivity in W/m·k which is less than 20.

12. The substrate mounting device of claim 5, wherein the focus ring is mounted with a pressing force pressing the focus ring toward the mounting table.

13. The substrate mounting device according to claim 5, wherein the focus ring includes an upper member and a lower member, and wherein said thermally conductive sheet is positioned between the lower member of the focus ring and the mounting table.

14. The substrate mounting device of claim 13, wherein the mounting table comprises an electrostatic chuck, and wherein the non-adhesive film is in contact with the electrostatic chuck.

15. The substrate mounting device of claim 5, wherein the non-adhesive film comprises a metal foil.

\* \* \* \* \*